(12) United States Patent
Min

(10) Patent No.: US 10,490,769 B2
(45) Date of Patent: Nov. 26, 2019

(54) WINDOW MEMBER AND METHOD OF MANUFACTURING THE SAME

(71) Applicant: SAMSUNG DISPLAY CO., LTD., Yongin-si, Gyeonggi-do (KR)

(72) Inventor: Myungan Min, Asan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 403 days.

(21) Appl. No.: 15/222,826

(22) Filed: Jul. 28, 2016

(65) Prior Publication Data

US 2017/0200914 A1 Jul. 13, 2017

(30) Foreign Application Priority Data

Jan. 11, 2016 (KR) .................. 10-2016-0003274

(51) Int. Cl.
*H01L 51/52* (2006.01)
*H01L 51/56* (2006.01)
*C03C 17/42* (2006.01)

(52) U.S. Cl.
CPC .......... *H01L 51/5237* (2013.01); *C03C 17/42* (2013.01); *H01L 51/56* (2013.01); *C03C 2217/479* (2013.01)

(58) Field of Classification Search
CPC ...... H01L 51/5237; H01L 51/56; G06F 3/041
See application file for complete search history.

(56) References Cited

U.S. PATENT DOCUMENTS

| 2014/0079917 A1* | 3/2014 | Huang ................. B32B 38/145 428/189 |
| 2014/0184525 A1* | 7/2014 | Kim ....................... G06F 3/044 345/173 |
| 2015/0103271 A1* | 4/2015 | Lee ......................... G06F 3/044 349/12 |

FOREIGN PATENT DOCUMENTS

| KR | 10-2005-0094993 A | 9/2005 |
| KR | 10-2005-0106948 A | 11/2005 |
| KR | 10-0909835 B1 | 7/2009 |
| KR | 10-2010-0058944 A | 6/2010 |
| KR | 10-1212345 B1 | 12/2012 |
| KR | 10-1457698 B1 | 10/2014 |

* cited by examiner

*Primary Examiner* — Laura C Powers
(74) *Attorney, Agent, or Firm* — Lewis Roca Rothgerber Christie LLP

(57) ABSTRACT

A window member includes a cover glass including a transmission area configured to pass a light therethrough and a bezel area surrounding the transmission area; a bottom layer arranged in the bezel area and having a color; an inorganic layer between the cover glass and the bottom layer; a pattern layer in the bezel area and contacting the cover glass; and a resin layer covering the pattern layer, at least a portion of the resin layer contacting the cover glass.

13 Claims, 13 Drawing Sheets

WINDOW MEMBER AND METHOD OF MANUFACTURING THE SAME

CROSS-REFERENCE TO RELATED APPLICATION

This application claims priority to and the benefit of Korean Patent Application No. 10-2016-0003274, filed on Jan. 11, 2016 in the Korean Intellectual Property Office, the content of which is hereby incorporated by reference.

BACKGROUND

1. Field

Aspects of the present disclosure relate to window member and a method of manufacturing the window member.

2. Description of the Related Art

A window member is disposed on a front surface of a display panel, such as a liquid crystal display panel, a plasma display panel, a light emitting diode display panel, etc, to protect a display screen. In particular, the window member is attached and fixed to an outer surface of the display panel to allow a user to recognize an input of the user or an output of the device.

Since the window member is formed on the outer surface of the device, the window member has a direct impact on the design of the device. Therefore, various attempts have been made to provide a variety of designs to the window member as well as functions to protect the display panel.

Conventionally a transparent synthetic resin is used as the window member; however, the transparent synthetic resin has defects or disadvantages, such as discoloration, low transmittance, etc. Recently, a tempered glass having a high transparency and a superior strength is being developed. The material e.g., the transparent synthetic resin, of the window member leas been replaced by the tempered glass.

SUMMARY

According to an aspect of embodiments of the present disclosure, a window member has an improved appearance. According to an aspect of embodiments of the present disclosure, a window member is capable of preventing or substantially preventing a pattern layer from being detached in a cleaning process after a cured resin layer is formed to improve a defect in appearance thereof.

According to another aspect of embodiments of the present disclosure, a method of manufacturing the window member is provided.

According to one or more embodiments of the inventive concept, a window member includes a cover glass including a transmission area configured to pass a light therethrough and a bezel area surrounding the transmission area; a bottom layer arranged in the bezel area and having a color; an inorganic layer between the cover glass and the bottom layer; a pattern layer in the bezel area and contacting the cover glass; and a resin layer covering the pattern layer, at least a portion of the resin layer contacting the cover glass.

The inorganic layer may include metal oxide, end the pattern layer may include a silver particle.

The pattern layer may include a same material as a material of the bottom layer.

The resin layer may be entirely overlapped with the bezel area when viewed in a plan view, and the pattern layer may be partially overlapped with the bezel area when viewed in the plan view.

The resin layer may cover a side surface and an upper surface of the pattern layer in the bezel area.

The bottom layer may be entirely overlapped with the bezel area when viewed in the plan view.

The inorganic layer may contact the in layer and may be spaced apart from the pattern layer.

According to one or more embodiments of the inventive concept, a window member includes a cover glass including a transmission area through which a light passes and a bezel area surrounding the transmission area, a bottom layer arranged in the bezel area, an inorganic layer between the cover glass and the bottom layer, a resin layer on a first surface of the inorganic layer and contacting the cover glass, and a pattern layer on a second surface of the inorganic layer opposite the first surface and in the bezel area.

The resin layer may contact the cover glass to expose at least one portion of the cover glass.

The inorganic layer may be on the resin layer and the exposed portion of the cover glass.

The pattern layer may be entirely overlapped with the resin layer when viewed in a plan view.

The pattern layer may be between the inorganic Dyer and the bottom layer, and the bottom layer may cover a side surface and an upper surface of the pattern layer.

The bottom layer may contact the inorganic layer and may expose at least a portion of the inorganic layer.

At least a portion of the pattern layer may partially cover an upper surface of the bottom layer.

According to one or more embodiments of the inventive concept, a method of manufacturing a window member includes providing a cover glass including a transmission area through which a light passes and a bezel area surrounding the transmission area, forming a pattern layer in the bezel area of the cover glass, forming a resin layer to cover the pattern layer, depositing a metal oxide on the resin layer to form an inorganic layer, and forming a bottom layer having a color on the inorganic layer.

The forming of the resin layer may include covering the pattern layer with a liquid resin, curing the liquid resin, and cleaning the cured liquid resin by providing a cleaning material.

The pattern leer ay not be exposed to the cleaning material in the cleaning process.

The liquid resin may be a light curable resin.

According to an aspect of one or more embodiments, the pattern layer of the window member is covered by the resin layer or is spaced apart from the resin layer such that the inorganic layer is between the pattern layer and the resin layer. Therefore, the pattern layer may be prevented or substantially prevented from being influenced in the cleaning process of the resin layer.

Accordion to another aspect of one or more embodiments, the pattern layer may be formed before the resin layer is formed, and the pattern layer may be covered by the resin layer. Thus, the pattern layer may be prevented or substantially prevented from making contact with the cleaning material during the cleaning process of the resin layer. As a result, the pattern layer may be prevented or substantially prevented from being damaged due to the cleaning material.

BRIEF DESCRIPTION OF THE DRAWINGS

The above and other aspects and advantages of the present disclosure will become readily apparent by reference to the following detailed description when considered in conjunction with the accompanying drawings wherein.

DETAILED DESCRIPTION

Hereinafter, some exemplary embodiments of the present disclosure will be described in further detail with reference to the accompanying drawings. However, embodiments of the present disclosure may be embodied in different forms and should not be construed as limited to the exemplary embodiments illustrated and set forth herein. Rather, these exemplary embodiments are provided by way of example for understanding of the invention and to convey the scope of the invention to those skilled in the art. As those skilled in the art would realize, the described embodiments may be modified in various different ways, all without departing from the spirit or scope of the present disclosure. The drawings and description are to be regarded as illustrative in nature and not restrictive.

Figure 1:
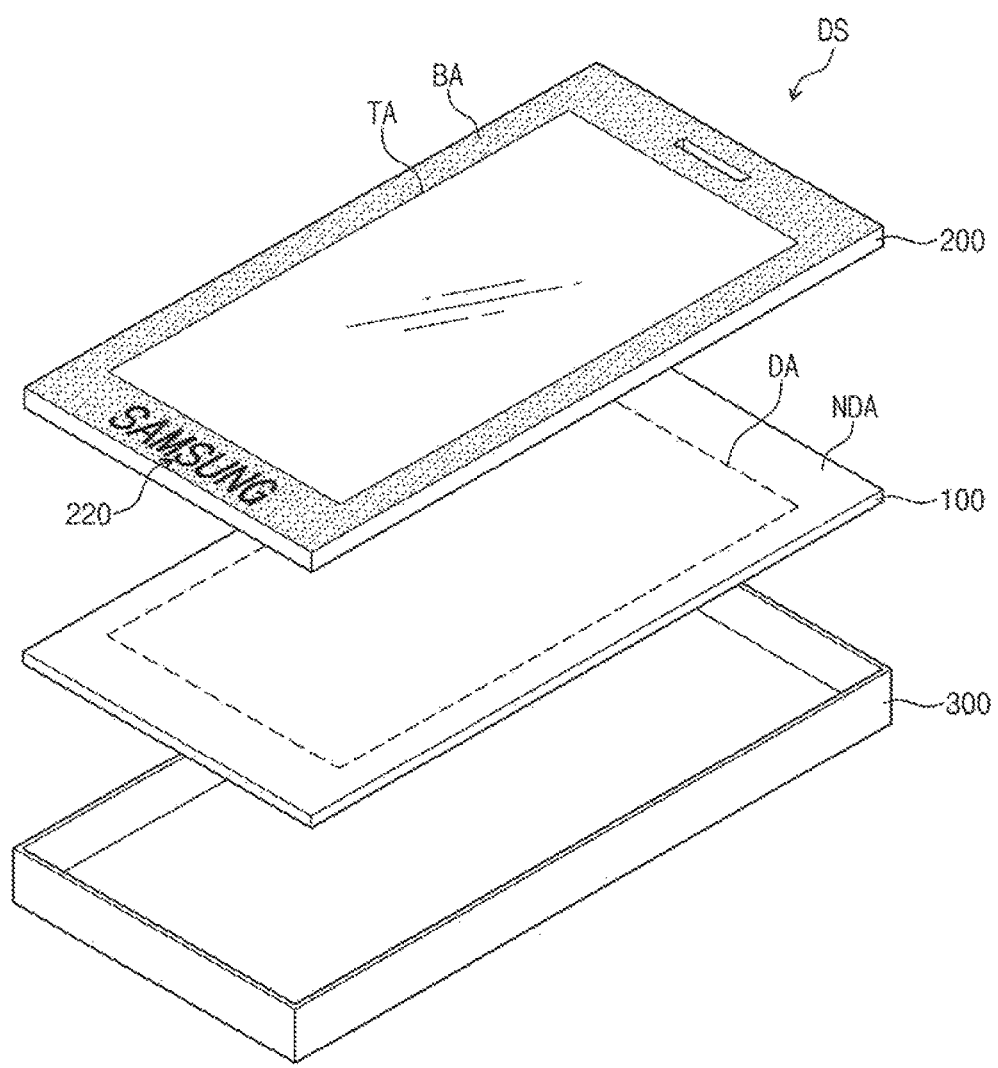
FIG. 1 is an exploded perspective view showing a display device including a window member according to an exemplary embodiment of the present disclosure.
Figure 2A:
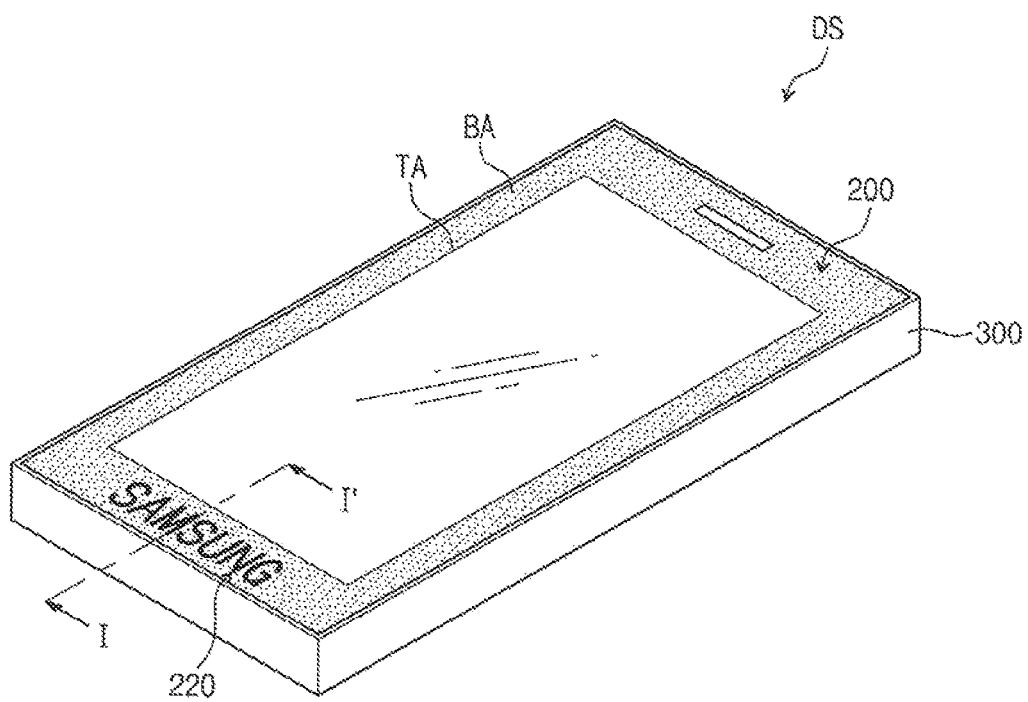
FIG. 2A is an assembled perspective view showing the display device of FIG. 1.
Figure 2B:
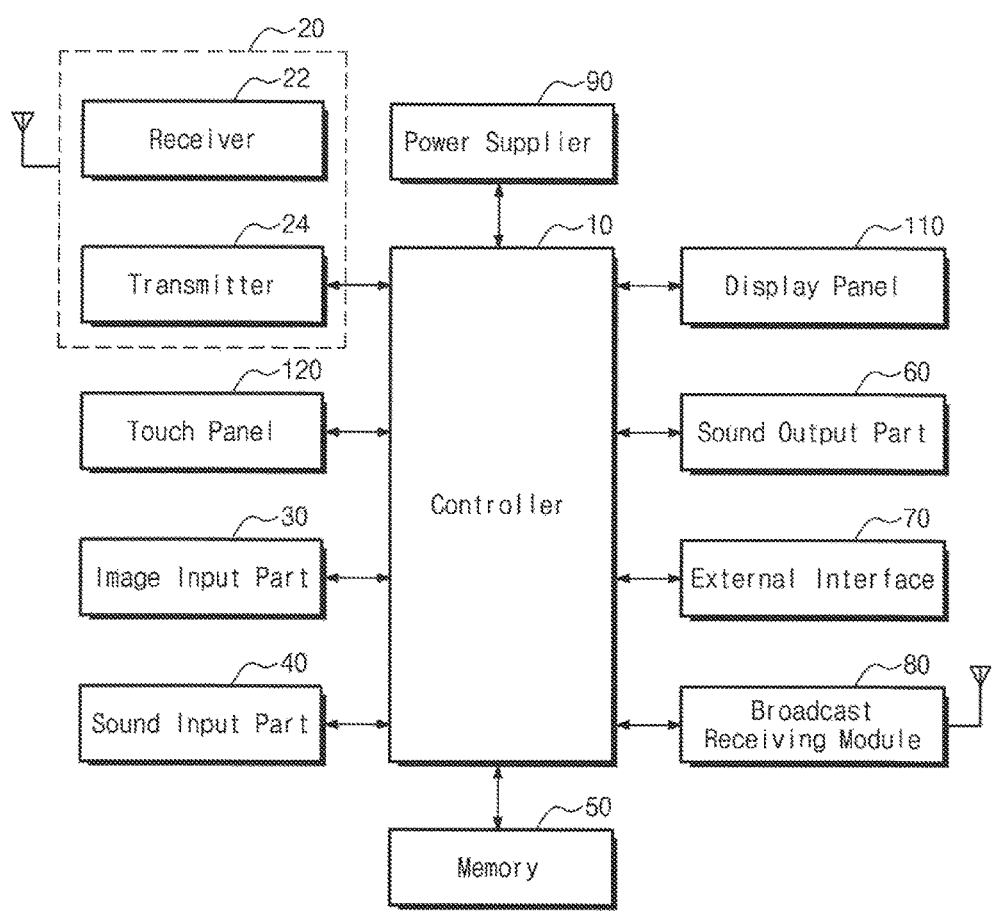
FIG. 2B is a block diagram of the display device of FIG. 1.
Figure 3:
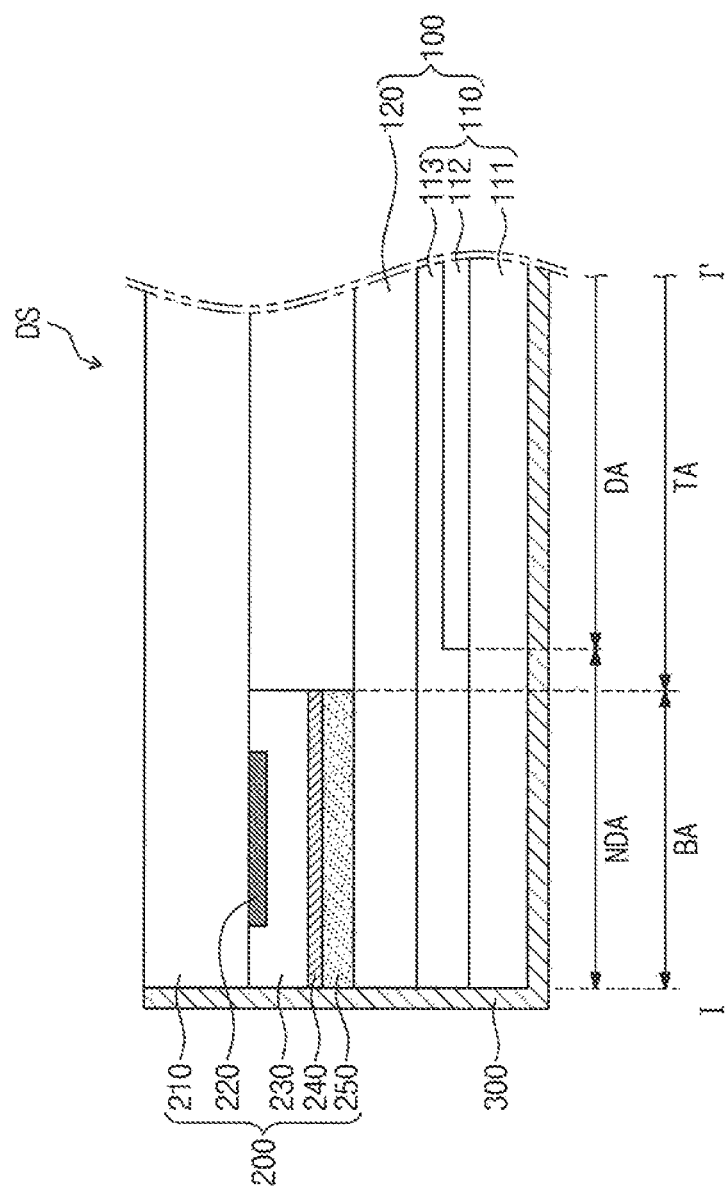
FIG. 3 is a cross-sectional view taken along a line I-I' of FIG. 2A.

FIG. 1 is an exploded perspective view showing a display device DS including a window member according to an exemplary embodiment of the present disclosure. FIG. 2A is an assembled perspective view showing the display device DS of FIG. 1. FIG. 2B is a block diagram of the display device of FIG. 1. FIG. 3 is a cross-sectional view taken along a line I-I' of FIG. 2A.

Referring to FIGS. 1 to 3, the display device DS includes a display member 100, a window member 200, and an accommodating member 300.

The display member 100 includes a display area DA and a non-display area NDA when viewed in a plan view. The display area DA displays an image. The display area DA, according to an embodiment, is defined at a center or central region of the display member 100.

The non-display area NDA is disposed adjacent to the display area DA. The non-display area NDA, according to an embodiment, has a frame shape surrounding the display area DA.

The display member 100 may have a plate shape or substantially plate shape. However, a size and a shape of the display member 100 in a plan view should not be limited to a specific size and shape. In FIG. 1, according to an embodiment, the display member 100 has substantially rectangular shape in a plan view, as representative example.

The display member 100, according to an embodiment, includes a display panel 110 and a touch panel 120. The display panel 110 generates the image in response to an electrical signal. The display panel 110 may be, but is not limited to, an organic light emitting display panel, a liquid crystal display panel, a plasma display panel, an electrophoretic display panel, or an electrowetting display panel.

Referring to FIG. 3, the display panel 110 includes a base layer a pixel layer 112 and a sealing layer 113.

The base layer 111 includes an insulating material. For example, the base layer 111 may include glass or plastic. However the material for the base layer 111 is not limited thereto or thereby.

The pixel layer 112 is disposed on the base layer 111. Although not shown in the drawing figures, the pixel layer 112 includes a plurality of pixels. Each of the pixels includes at least one thin film transistor and a display element driven by the thin film transistor.

The display element may be an organic light emitting element, a liquid crystal capacitor, an electrophoretic device, or a conductive ink. In the present exemplary embodiment, an organic light emitting display panel including the organic light emitting element will be described as the display panel 110 as a representative example.

The pixels realize the image corresponding to an electrical signal applied thereto. Thus, an area where the pixel layer 112 is disposed corresponds to the display area DA displaying the image.

The sealing layer 113 is disposed on the base layer 111 to cover the pixel layer 112. The sealing layer 113 seals the pixel layer 112 to protect the pixel layer 112 from outside.

The sealing layer 113 includes a transparent material to allow the image generated by the pixel layer 112 to be recognized at the outside. The sealing layer 113, according to an embodiment, has a structure in which a plurality of organic thin layers and/or inorganic thin layers are stacked. Thus, a flexibility of the display panel 110 may be improved.

In an embodiment, the sealing layer 113 may be a glass substrate or a plastic substrate. Thus, a rigidity of the sealing layer 113 is enhanced, and a reliability of the display panel 110 is improved. The display panel 110 may further include a sealing member coupling the sealing layer 113 and the base layer 111.

The touch panel 120 detects a signal caused by an external input. The external input, may be generated by a stylus pen or a finger/fingers of a user. The external input is substantially generated on the window member 200.

The touch panel 120, according to an embodiment, is directly disposed on the sealing layer 113. In this case, the touch panel 120 is formed by directly depositing a plurality of touch patterns on the sealing layer 113. In another embodiment, the touch panel 120 may be attached onto the sealing layer 113 after being separately formed.

Although not shown in the drawing figures, the touch panel 128 and the display panel 110 may be integrally formed with each other as a single unitary and individual unit. In this case, the touch panel 120 may be disposed in the display panel 110. However the touch panel 120 should not be limited thereto or thereby, and the touch panel 120 may be provided in any of various ways.

In addition, a driving method of the touch panel 120 should not be limited to a specific one. For instance, a resistive type touch panel or a capacitive type touch panel may be applied to the display panel 110. In another embodiment, the touch panel 120 may be omitted from the display device.

Referring to FIG. 2B, the display member 100 further includes components required to perform functions of the display device DS in addition to the display panel 110 and the touch panel 120. For instance, according to an embodiment, the display member 100 includes a controller 10, a wireless communication module 20, an image input pail 30, a sound input part 40, a memory 50, a sound output part 60, an external interface 70, a broadcast receiving module 80, and a power supplier 90, etc.

The controller 10 controls an overall operation of a mobile phone, for example. For instance, the controller 10 performs control and process operations related to a voice call, a data communication, a video call, etc. In addition, the controller 10 may control an operation of the touch panel 120 in addition to a conventional function thereof. For instance, the controller 10 may control the display panel 110, the image input part 30, the memory 50, and the sound output part 60 on the basis of coordinate information provided from the touch panel 120.

The wireless communication module 20, according to an embodiment, transmits and receives wireless signals to and from a base station of a mobile communication system. For example, the wireless communication module 20 may transmit and receive sound data, text data, image data, and/or control data to and from the base station of the mobile communication system under the controlling of the controller 10. The wireless communication module 20 includes a transmitter 22 modulating a signal to be transmitted, and a receiver 24 demodulating the signal applied thereto.

The image input part 30 processes an image signal to convert the image signal into image data displayable on the display panel 110.

The sound input part 40 receives an external sound signal through a microphone in a call mode, a record mode, a voice recognition mode etc., and converts the external sound signal to electrical voice data. The sound input part 40 may realize various noise cancelling algorithms to remove a noise generated during the process of receiving the external sound signal.

The memory 50, according to an embodiment, stores the image data provided from the image input part 30 and the voice data provided from the sound input part 40.

The sound output part 60 converts the voice data provided from the wireless communication module 20 and the voice data stored in the memory 50 and outputs the converted voice data.

The external interface 70 serves as an interface with peripheral devices other than a mobile terminal, such as a wired/wireless headset an external charger, a wired/wireless data port, a card socket (e.g., a memory card and SIM/UM card) etc., which are connected to the mobile terminal.

The broadcast receiving module 80 receives: a broadcasting signal transmitted via satellite or terrestrial waves and converts the received broadcasting signal to a form of broadcasting data to be output to the sound output part 60 and the display panel 110.

Referring to FIGS. 1 to 3 again, the window member 200 is disposed on a front surface of the display member 100.

The window member 200 protects the display member 100 from external factors. The window member 200 may have various shapes and sizes when viewed in a plan view and should not be limited to a specific shape and size. For example, the window member 200 may have a substantially quadrangular shape when viewed in a plan view, as illustrated in FIGS. 1 and 2A.

The window member 200, according to an embodiment, includes a cover glass 210 a pattern layer 220, a resin layer 230, an inorganic layer 240, and a bottom layer 250. In an embodiment, the cover glass 210, the pattern layer 220, the resin layer 230, the inorganic layer 240, and the bottom layer 250 may be sequentially stacked along a thickness direction of the window member 200.

The cover glass 210 includes a transmission area TA and a bezel area BA when viewed in a plan view. The bezel area BA is disposed adjacent to the transmission area TA. The bezel area BA, according to an embodiment, may have a frame shape surrounding the transmission area TA.

The transmission area TA corresponds to an area through which a light passes. The transmission area TA, according to an embodiment, covers the display area DA. Accordingly, the image displayed in the display area DA is recognized from the outside through the transmission area TA.

The bezel area BA corresponds to an area that blocks a light. The bezel area BA, according to an embodiment, is disposed in the non-display area NDA. Thus, the non-display area NDA is blocked by the bezel area BA and is invisible from the outside.

The cover glass 210 protects the display member 100. In addition, the cover glass 210 corresponds to a component to which an external pressure is substantially applied. Thus, the cover glass 210 includes a material having a rigidity (e.g., a predetermined rigidity). The cover glass 210 may be a glass. In an embodiment, the cover glass 210 may be a tempered glass.

The pattern layer 220 is disposed at a lower surface of the cover glass 210, The pattern layer 220, according to an embodiment, is disposed in the bezel area BA. The pattern layer 220, according to an embodiment, is regarded as a bezel design of the display device DS or may serve as a logo of a specific brand, for example.

The pattern layer 220 may have various shapes on the plane surface of the window member 200. In FIGS. 1 and 2A, the shape of the pattern layer 220 is illustrated with the phrase of "SAMSUNG" as an exemplary embodiment.

The pattern layer 220, according to an embodiment, includes a light blocking material. For example, the pattern layer 220 may include a material having a low transmittance or a material having a high reflectivity. In an embodiment, the pattern layer 220 may include an inorganic compound, such as metal oxide, or an organic compound, such as polymer resin. In an embodiment, the pattern layer 220 may include silver (Ag) particles.

The resin layer 230 is disposed under the cover glass 210. In the present exemplary embodiment, the resin layer 230 makes contact with the lower surface of the cover glass 210.

The resin layer 238 may enhance impact resistance of the cover glass 210. The resin layer 230 may include a predetermined pattern. Since the pattern of the resin layer 230 may be visible at the outside, the pattern of the resin layer 230 may have an effect on design outcomes.

The resin layer 230, according to an embodiment, is entirely overlapped with the bezel area BA. The resin layer 230, according to an embodiment, entirely covers the pattern layer 220.

The resin, layer 230 covers a side surface and an upper surface of the pattern layer 220 in the bezel area BA. Therefore, the pattern layer 220 is buried in the resin layer 230 on the lower surface of the cover glass 210 such that the pattern layer 220 is not exposed to the outside of the resin layer 230.

The resin layer 230 may include a transparent material. The resin layer 230 may include a curable material. The curable material may include a light curable resin, a thermally curable resin, etc. For instance, the resin layer 230 may include a UV curable resin.

The inorganic layer 240 is disposed under the resin layer 230. Since, according to an embodiment, the resin layer 230 is entirely overlapped with the bezel area BA, the inorganic layer 240 is spaced apart from the pattern layer 220 in a thickness direction such that the resin layer 230 is disposed between the inorganic layer 240 and the pattern layer 220.

The inorganic layer 240 includes an inorganic material. In an embodiment, the inorganic layer 240 may include metal oxide. For example, the inorganic layer 240 may include silicon oxide, titanium oxide, or a combination thereof.

The inorganic layer 240 may have a relatively high reflectivity In a case that the resin layer 230 includes a pattern, the pattern is easily visible from the outside by the inorganic layer 240.

The bottom layer 250 is disposed under the inorganic layer 240. The bottom layer 250 defines the bezel area BA. In an embodiment, the bottom layer 258 blocks the light such that a lower portion of the bezel area BA is invisible from the outside.

The bottom layer 250 may have a color (e.g., a predetermined color). The bottom layer 250 may have a black color or any, other suitable color(s). The color of the bottom layer 250 is defined as a color of the bezel area BA.

The bottom layer 250, according to an embodiment includes a non-transparent material. In an embodiment, the bottom layer 250 may include an inorganic compound, such as metal oxide, or an organic compound, such as polymer resin.

The accommodating member 300 includes an inner space defined therein. The accommodating member 300 accommodates the window member 208 and the display member 100 in the inner space thereof. The accommodating member 300 and the window member 200 are coupled to each other to define an appearance of the display device DS.

Although not shown in the drawing figures, the components driving the display device DS and supplying a power source voltage to the display device DS may be accommodated in the inner space of the accommodating member 300. The display device DS according to the present exemplary embodiment of the present disclosure may have any of various shapes, and it should not be limited to those shown or described herein.

Figure 4:
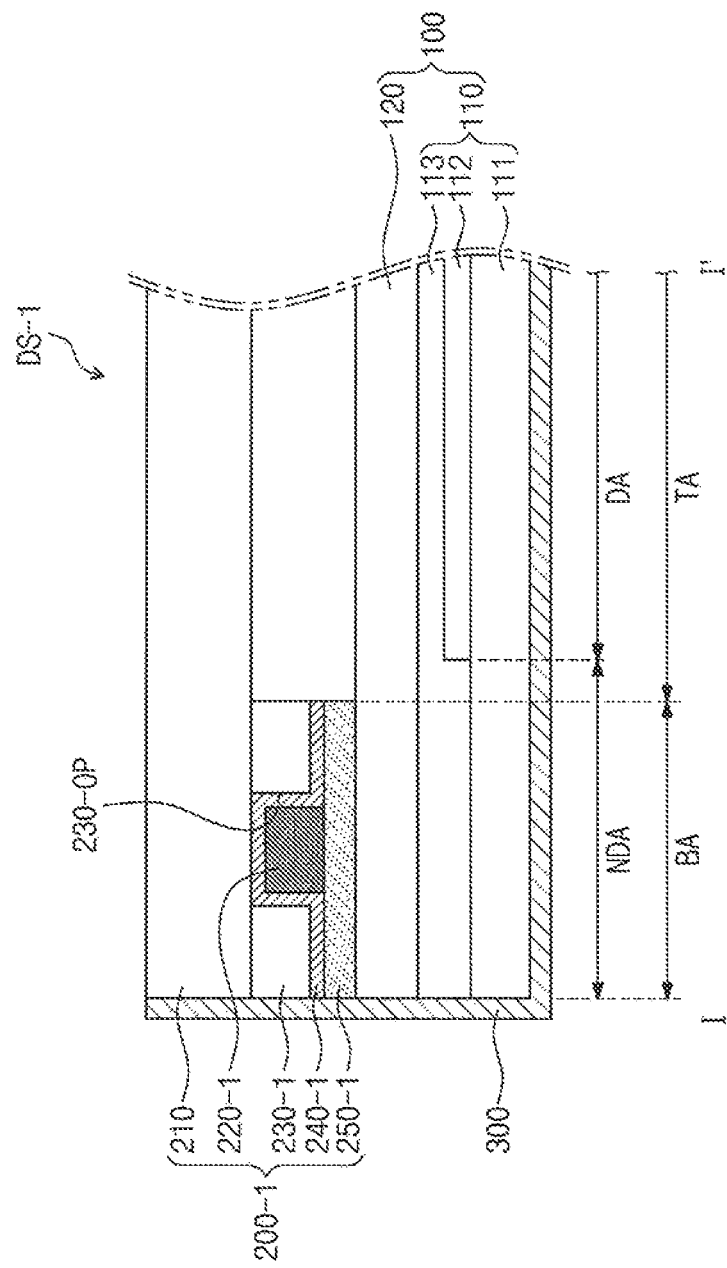
FIG. 4 is a cross-sectional view showing a portion of a display device including a window member according to an exemplary embodiment of the present disclosure.

FIG. 4 is a cross-sectional view showing a portion of a display device DS-1 including a window member according to an exemplary embodiment of the present disclosure. FIG. 4 shows a portion corresponding to the portion of the display device DS shown in FIG. 3.

The display device DS-1 shown in FIG. 4, according to an embodiment, has the same elements as those in, the display device DS shown in FIG. 3 except for a window member 200-1. Thus, in FIG. 4, the same reference numerals denote the same elements in FIGS. 1 to 3, and thus further descriptions of the same elements will be omitted.

As shown in FIG. 4, the window member 200-1 includes the cover glass 210, a pattern layer 220-1, a resin layer 230-1, are inorganic layer 240, and a bottom layer 250-1.

The resin layer 230-1 makes contact with a lower surface of the cover glass 210. The resin layer 230-1 may have a predetermined pattern in the bezel area BA.

The pattern may be defined by an opening 230-OP. The opening 230-OP corresponds to an area where the pattern layer 220-1, which will be described later, is disposed. The opening 230-OP exposes a portion of the bezel area BA of the cover glass 210. Thus, the bezel area BA is divided into an area covered by the resin layer 230-1 and an exposed area not covered by the resin layer 230-1.

The inorganic layer 240-1 is disposed under the resin layer 230-1. The inorganic layer 240-1 covers a surface of the resin layer 230-1.

The inorganic layer 240-1 covers the surface of the resin layer 230-1 and the cover glass 210 exposed through the exposed area, which are disposed in the bezel area BA. Thus, the inorganic layer 240-1 is disposed along the surface of the resin layer 230-1 and the exposed cover glass 210 and thus the inorganic layer 240-1 has a bent shape in a cross-sectional view.

The pattern layer 220-1 is disposed on the inorganic layer 240-1 corresponding to the exposed area of the bezel area BA.

The pattern layer 220-1 is disposed in the opening 30-OP. Therefore, the opening 230-OP is filled with a portion of the inorganic layer 240-1 and the pattern layer 220-1.

In this case, a lower surface of the pattern layer 220-1 and a lower surface of the inorganic layer 240-1 except for an area where the opening 230-OP is disposed e aligned with each other when viewed in a cross-sectional view. That is, the pattern layer 220-1 may provide a flat surface (e.g., a predetermined flat surface) at the lower portion of the inorganic layer 240-1, which has the bent shape.

The bottom layer 250-1 is disposed on the lower surface of the inorganic layer 240-1 and the pattern layer 220-1. The bottom layer 250-1 is disposed on the flat surface. The bottom layer 250-1 entirely covers the pattern layer 220-1 and the inorganic layer 240-1.

The pattern layer 220-1 according to the present exemplary embodiment is disposed in the opening 230-OP of the resin layer 230-1; however, the pattern layer 220-1 may be spaced apart from the resin layer 230-1 due to the inorganic layer 240-1 being disposed between the pattern layer 220-1 and the resin layer 230-1. The pattern layer 220-1, according to an embodiment, does not make contact with the resin layer 230-1.

In addition the pattern layer 220-1 is spaced apart from the cover glass 210. The pattern layer 220-1 has a higher binding force with respect to the inorganic layer 240-1 than the cover glass 210. Accordingly, the window member 200-1 includes the pattern layer 220-1 which is stably disposed and thus the window member 200-1 has an improved reliability.

Figure 5:
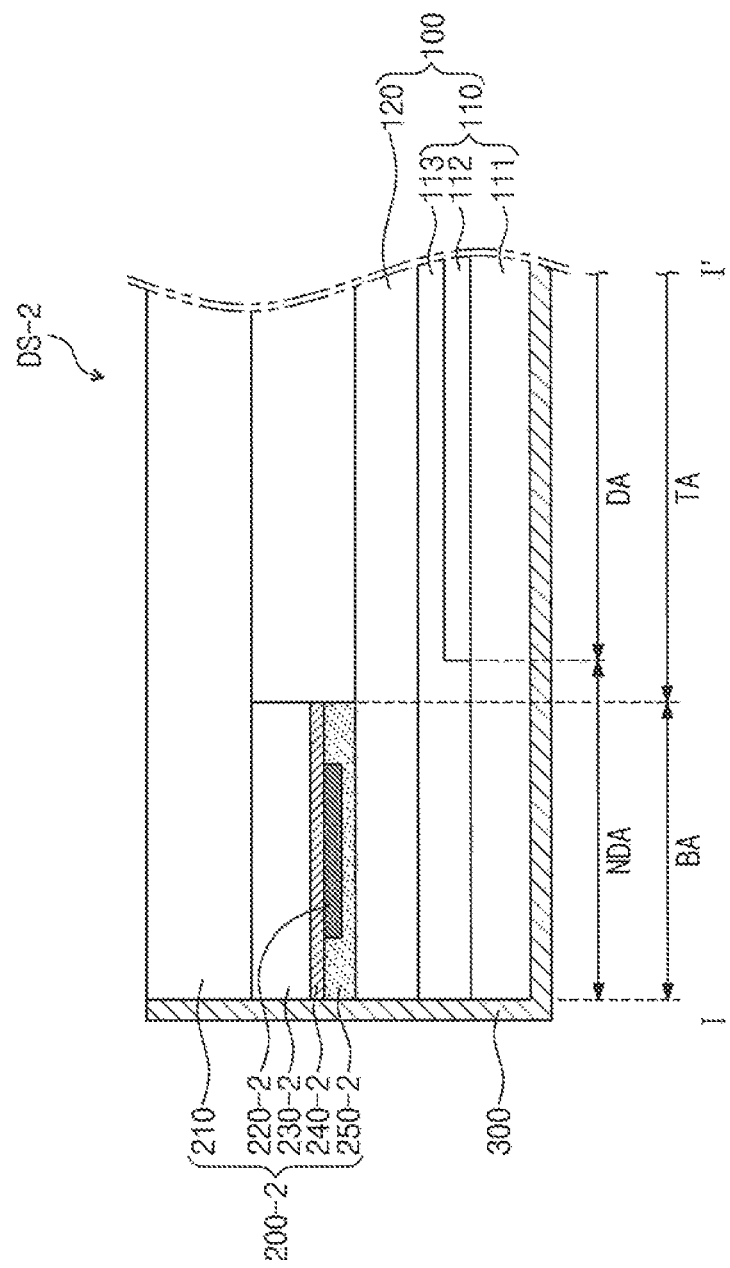
FIG. 5 is a cross-sectional view showing a portion of a display device including a window member according to an exemplary embodiment of the present disclosure.
Figure 6:
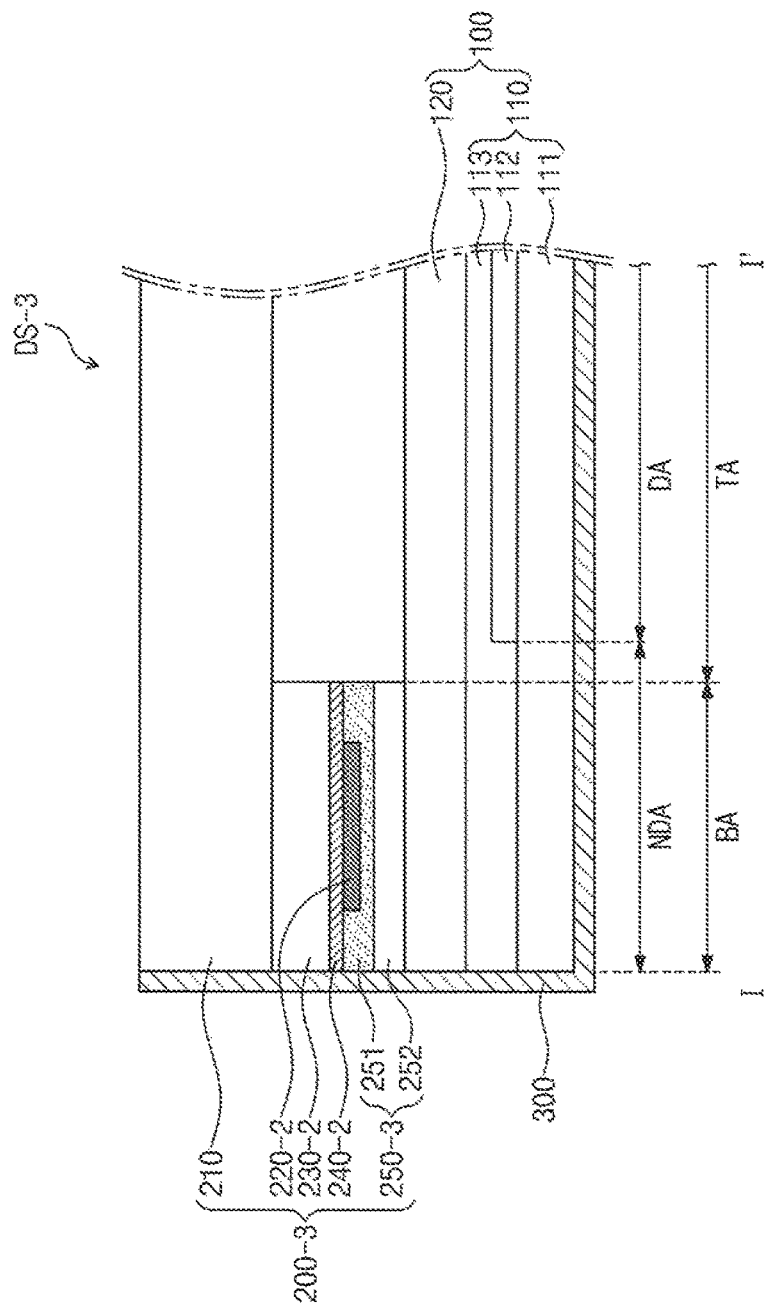
FIG. 6 is a cross-sectional view showing a portion of a display device including a window member according to an exemplary embodiment of the present disclosure.

FIG. 5 is a cross-sectional view showing a portion of a display device DS-2 including a window member according to an exemplary embodiment of the present disclosure. FIG. 6 is a cross-sectional view showing a portion of a display device including a window member according to an exemplary embodiment of the present disclosure. FIGS. 5 and 6 show portions corresponding to the portion of the display device DS shown in FIG. 3.

The display device DS-2 shown in FIG. 5, according to an embodiment, and the display device DS-3 shown in FIG. 6, according to an embodiment, have the same elements as in the display device DS shown in FIG. 3 except for a window member 200-2. Thus, in FIGS. 5 and 6, the same reference numerals denote the same elements in FIGS. 1 to 3, and thus further descriptions of the same elements will be omitted.

As shown in FIG. 5, the window member 200-2 includes the cover glass 210, a pattern layer 220-2, a resin layer 230-2, an inorganic layer 240-2, and, a bottom layer 250-2.

The resin layer 230-2, according, to an embodiment, makes contact with an entire area of a lower surface of the cover gas 210. The resin layer 230-2 has substantially the same shape as the bezel area BA when viewed in a plan view.

The inorganic layer 240-2 is disposed under the resin layer 230-2. The inorganic layer 240-2 is spaced apart from the cover glass 210 due to the resin layer 230-2 being disposed between the inorganic layer 240-2 and the cover glass 210. The inorganic layer 240-2, according to an embodiment, entirely covers a lower surface of the resin layer 230-2.

The pattern layer 220-2 is disposed under the inorganic layer 240-2. The pattern layer 220-2 is spaced apart from the resin layer 230-2 due to the inorganic layer 240-2 being disposed between the pattern layer 220-2 and the resin layer 230-2.

The bottom layer 250-2 covers the pattern layer 220-2 and the inorganic layer 240-2. In an embodiment, the pattern layer 220-2 is buried in the bottom layer 250-2, and the pattern layer 220-2 is not exposed outside of the bottom layer 250-2.

Referring to FIG. 6, a bottom layer 250-3 includes a plurality of layers. The bottom layer 250-3 includes a first layer 251 and a second layer 252.

The first layer 251 is disposed under the inorganic layer 240-2 and covers the pattern layer 220-2. The first layer 251 corresponds to the bottom layer 250-2 shown in FIG. 5. The second layer 252 is disposed under the first layer 251.

Each of the first and second layers 251 and 252 has a color (e.g., predetermined color). The first layer 251 and the second layer 252 may have the same color as each other or different colors from each other. A color of the bezel area BA may be determined by a combination of the color of the first layer 251 and the color of the second layer 252.

Figure 7:
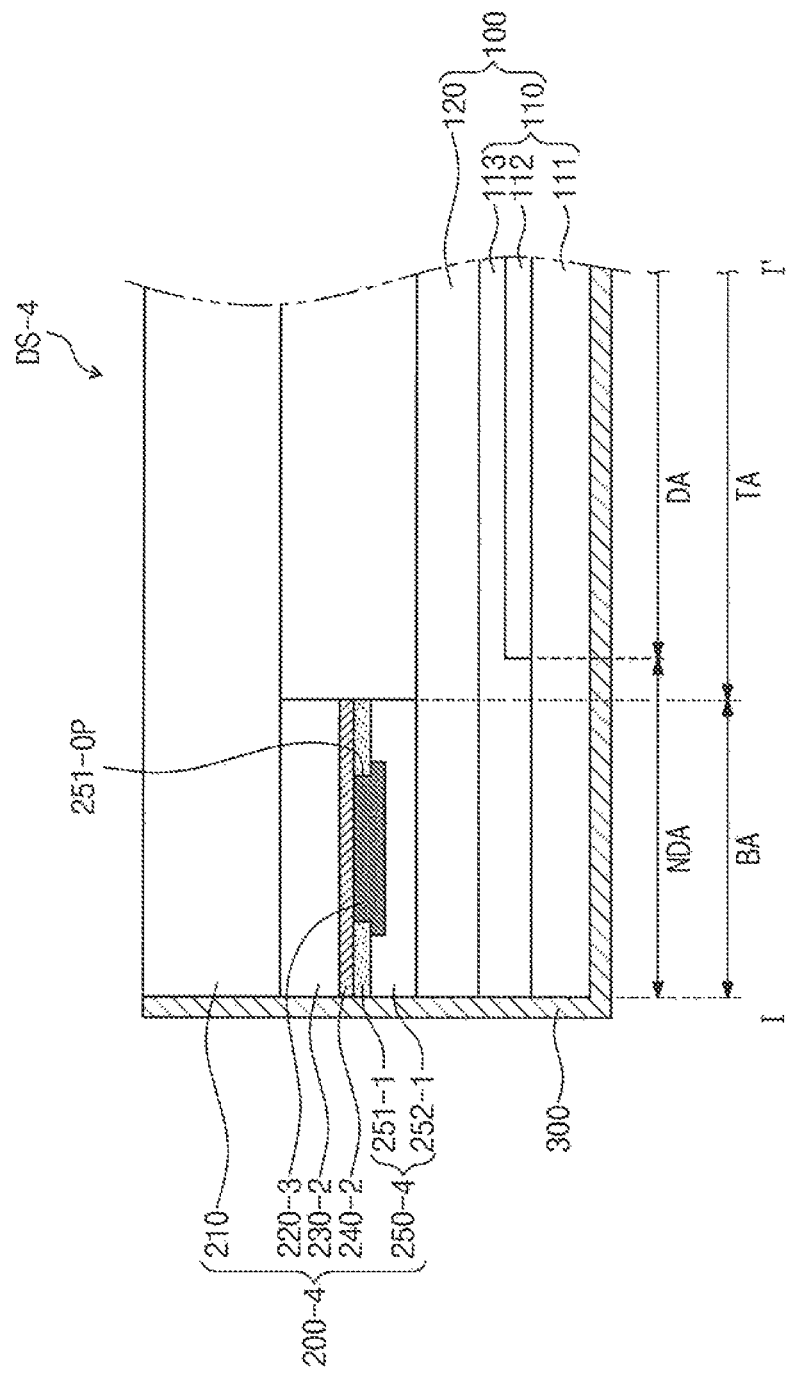
FIG. 7 is cross-sectional view showing a portion of a display device including a window member according to an exemplary embodiment of the present disclosure.

FIG. 7 is a cross-sectional view showing a portion of a display device DS-4 including a window member according to an exemplary embodiment of the present disclosure. FIG. 7 shows the portion corresponding to the portion of the display device DS shown in FIG. 3.

The display device DS-4 in FIG. 7, according to an embodiment, has the same elements as in the display device DS-2 shown in FIG. 5 and the display device DS-3 shown in FIG. 6 except for a window member 200-4. Thus, in FIG. 7, the same reference numerals denote the same elements in FIGS. 5 and 6, and thus further descriptions of the same elements will be omitted.

As shown in FIG. 7 the window member 200-4 includes a pattern layer 220-3 and a bottom layer 250-4. The bottom layer 250-4 includes a first layer 251-1 and a second layer 252-1.

An opening (e.g., a predetermined opening) 251-OP is defined through the first later 251-1. The pattern layer 220-3 is filled in the opening 251-OP.

In an embodiment, at least a portion of the pattern layer 220-3 may be protruded downward beyond a lower surface of the first layer 251-1. The pattern layer 220-3 may be partially overlapped with the first layer 251-1.

The second layer 252-1 covers the first layer 251-1 and the pattern layer 220-3. The pattern layer 220-3 is covered by the second layer 252-1 such that the pattern layer 220-3 is not exposed to an outside of the second layer 252-1.

Figure 8:
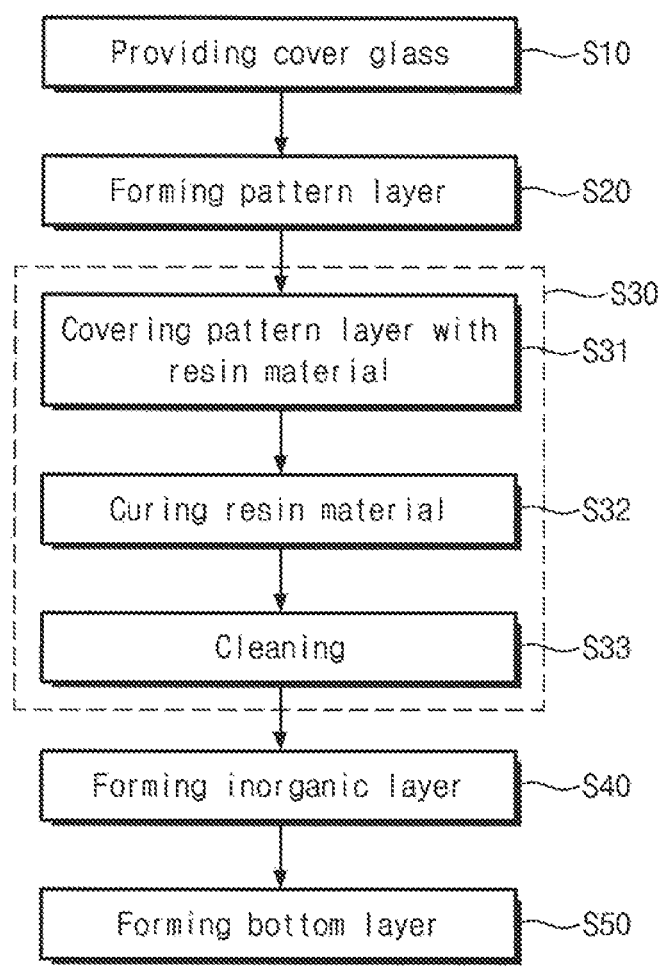
FIG. 8 is a flowchart showing a method of manufacturing window member according to an exemplary embodiment of the present disclosure.

FIG. 8 is a flowchart showing a method of manufacturing a window member according to an exemplary embodiment of the present disclosure. FIGS. 9A to 9E are cross-sectional views showing a method of manufacturing a window member according to an exemplary embodiment of the present disclosure.

Referring to FIG. 8, the method of manufacturing the window member according to an exemplary embodiment includes providing a cover glass (S10), forming a pattern layer in a bezel area BA of the cover glass (S20), forming a resin layer to cover the pattern layer (S30), depositing metal oxide on the resin layer to form an inorganic layer (S40), and forming a bottom layer having a color (e.g., a predetermined color) on the inorganic layer (S50). The forming of the resin layer (S30) includes covering the pattern layer using a liquid resin material (S31) curing the liquid resin material (S32), and cleaning a surface of the resin layer end a surface of the cover glass (S33).

Figure 9A:
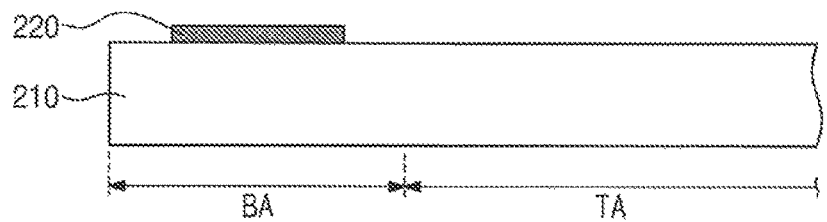
FIGS. 9A to 9E are cross-sectional views showing the method of manufacturing the window member according to an exemplary embodiment of the present disclosure.

As shown in FIGS. 8 and 9A, the cover glass 210 including the transmission area TA through which a light passes and the bezel area BA surrounding the transmission area TA is provided The pattern layer 220 is formed in the bezel area BA of the cover glass 210. The pattern layer 210 is patterned to be partially overlapped with the bezel area BA.

A non-transparent material is coated on the bezel area BA of the cover glass 210 to form a non-transparent layer, and the non-transparent layer is patterned to form the pattern leer 220. Although not shown in the drawing figures, a surface treatment process may be further performed on the cover glass 210 before the pattern layer 220 is formed.

Figure 9B:
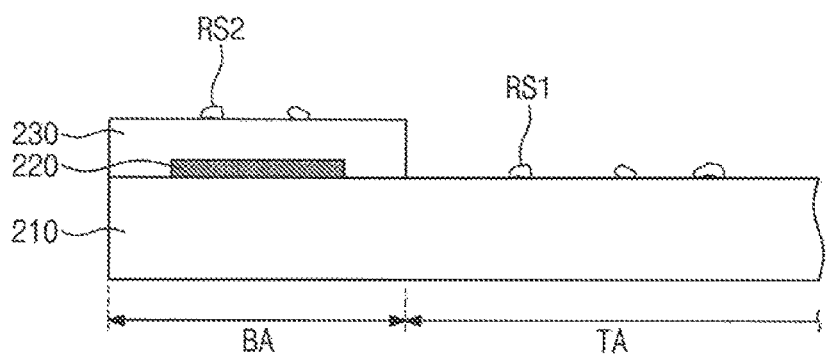

Referring to FIGS. 8 and 9B, according to an embodiment, the liquid resin material coated on the bezel area BA of the cover glass 210 to entirely cover the pattern layer 220 (S31), and the liquid resin material cured to form the resin layer 230 (S32), in this case, an uncured material RS1 or a foreign substance RS2 such as dust may exist on the transmission area TA of the cover glass 210 or the resin layer 230.

The resin layer 230, according to an embodiment may be formed by a light curing process. In particular, the resin layer 230 may be formed by a UV curing process The resin layer 230, according to an embodiment, may be formed by a molding process to form a pattern in the resin layer 230.

Figure 9C:
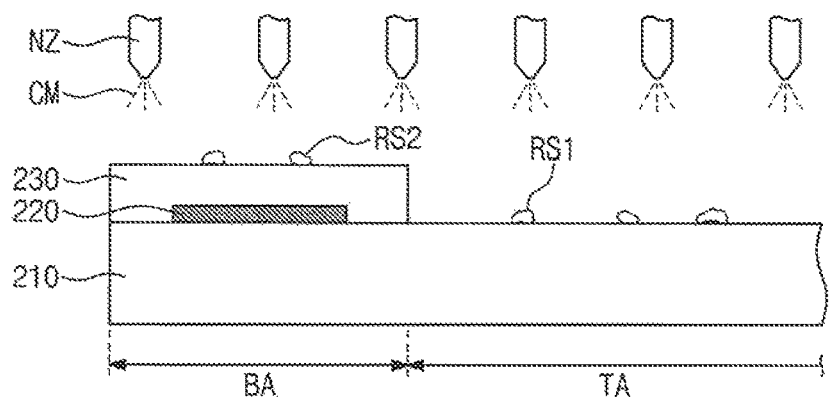

Referring to FIGS. 8 and 9C, the cleaning process is performed using a cleaning device NZ (S33). The cleaning operation (S33) may be performed using any of a variety of methods. In the present exemplary embodiment, the cleaning process is performed using an ultrasonic wave, but it should not be limited thereto or thereby. That is the cleaning process to remove the remaining foreign substance may be performed through any of various methods.

in the cleaning process (S33), a predetermined cleaning material CM may be provided through the cleaning device NZ. The surface of the resin layer 230 and the surface of the cover glass 210 are exposed to the predetermined cleaning material CM to be cleaned. Therefore, the uncured material RS1 and the foreign substance RS2, which remain after the curing of the resin material (S32), may be easily removed.

Figure 9D:
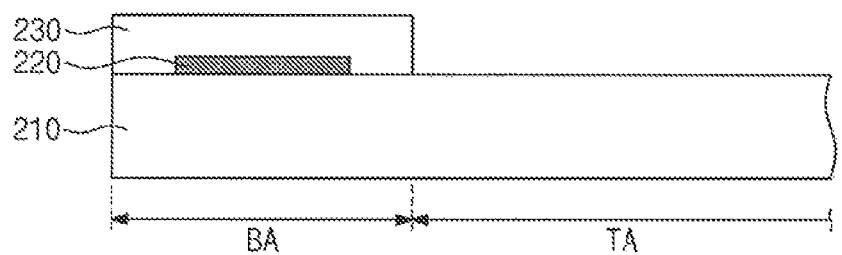

As described earlier, the pattern layer 220 according to the present exemplary embodiment is entirely covered by the resin layer 230 during the cleaning process (S33) and is not exposed to the cleaning material CM. Accordingly, as shown in FIG. 9D, the pattern layer 220 is prevented or substantially prevented from being detached or damaged due to the cleaning material CM, and thus the pattern layer 220 stably remain s after the cleaning process (S33).

Referring to FIGS, 8 and 9E, the inorganic layer 240 and the bottom layer 250 are sequentially formed on the resin layer 230.

The inorganic layer 240, according to an embodiment, may be formed by depositing a metal oxide on the resin layer 230. The inorganic layer 240, according to an embodiment, may be formed through a non-conductive vacuum metallization. In this case, titanium oxide and silicon oxide may be used as the deposition material.

The bottom layer 250 is formed to have a shape corresponding to the bezel area BA. The bottom layer 250, according to an embodiment, is formed by depositing a non-transparent material on the Inorganic layer 240. The bottom layer 250, according to an embodiment, may be formed by patterning an organic material, However, the method of forming the bottom layer 250 should not be limited thereto or thereby, and the bottom layer 250 may be formed through any of various methods.

As described above, the pattern layer 220 according to the present exemplary embodiment of the present disclosure is not exposed to the outside during the cleaning process. Accordingly, the pattern layer 220 is prevented or substantially prevented from being damaged due to the cleaning material CM, and thus defects in appearance of the window member 220 may be improved.

Figure 10A:
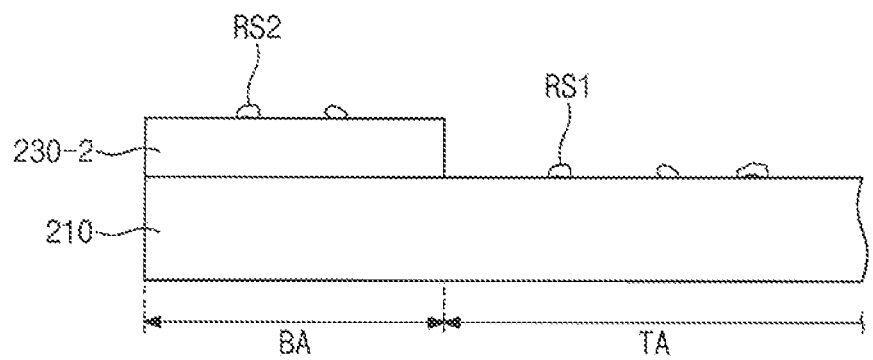
FIGS. 10A to 10C are cross-sectional views showing a method of manufacturing a window member according to an exemplary embodiment of the present disclosure.
Figure 10B:
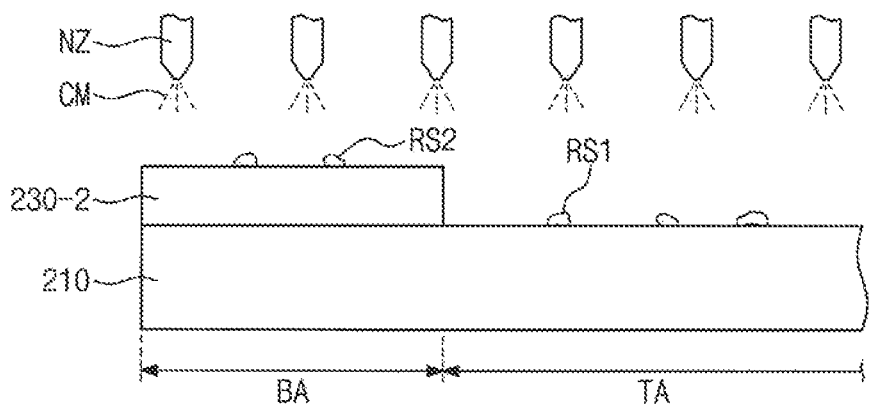
Figure 10C:
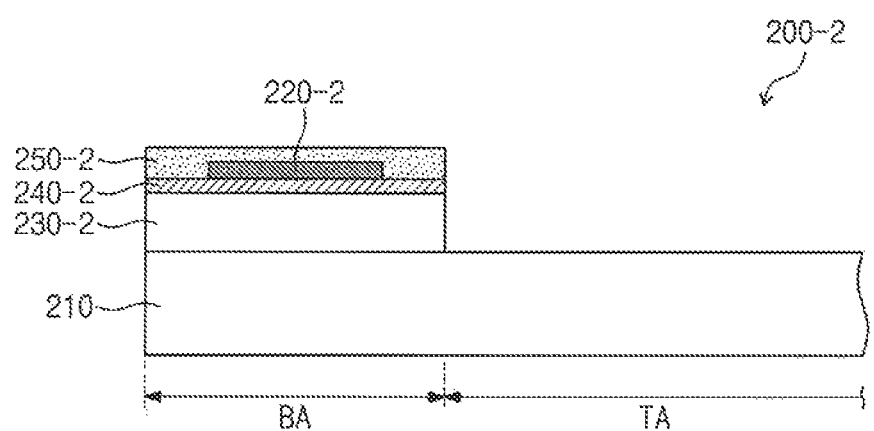

FIGS. 10A to 10C are cross-sectional views showing a method of manufacturing a window member according to an exemplary embodiment of the present disclosure.

Figure 9E:
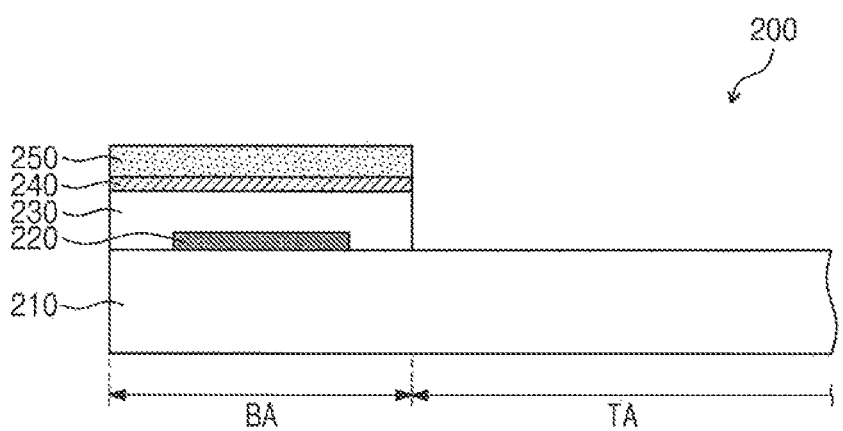

FIGS. 10A to 10C show operations of manufacturing a window member corresponding to the operations shown in FIGS. 9B, 9C, and 9E. In FIGS. 10A to 10C, the same reference numerals denote the same elements in FIGS, 9B, 9C, and 9E, and thus further descriptions of the same elements will be omitted.

Referring to FIG. 10A, according to a embodiment, a liquid resin material is coated to be entirely overlapped with the bezel area BA of the cover glass 210. The liquid resin material is cured to form a resin layer 230-2. An uncured material RS1 or a foreign substance RS2 such as dust may remain in the transmission area TA of the cover glass 210 or the resin layer 230-2 in the curing process.

Referring to FIG. 10B, a cleaning process is performed to remove the uncured material RS1 or the foreign substance RS2.

Referring to FIG. 10C, the inorganic layer 240-2, the pattern layer 220-2, and the bottom layer 250-2 are sequentially formed on the resin layer 230-2.

The inorganic layer 240-2, according to an embodiment, may be formed by depositing a metal oxide on the resin layer 230-2.

The pattern layer 220-2 is formed on the inorganic layer 240-2 The pattern layer 220-2, according to an embodiment, is formed by depositing a non-transparent material on the inorganic layer 240-2 or by patterning an organic material. Since the pattern layer 220-2 is formed after the cleaning process, the pattern layer 220-2 is prevented from being detached or damaged due to the cleaning material CM.

The bottom layer 250-2 is formed to cover the inorganic layer 240-2 and the pattern layer 220-2. The bottom layer 250-2, according to an embodiment, is formed by depositing a non-transparent material. In an embodiment, the bottom layer 250-2 may be formed by patterning an organic material. The bottom layer 250-2, according to an embodiment, is formed to entirely cover the pattern layer 220-2.

Although some exemplary embodiments of the present disclosure have been described, it is to be understood that the present disclosure should not be limited to these exemplary embodiments, but, rather, various changes and modifications can be made by one of ordinary skill in the art within the, spirit and scope of the present disclosure as hereinafter claimed.

What is claimed is:

1. A window member comprising:
    a cover glass comprising a transmission area configured to pass a light therethrough and a bezel area surrounding the transmission area;
    a bottom layer entirely covering the bezel area and having a color;
    an inorganic layer between the cover glass and the bottom layer;
    a pattern layer in the bezel area and contacting the cover glass; and
    a resin layer covering the pattern layer, at least a portion of the resin layer contacting the cover glass,
    wherein, when viewed in a plan view, the pattern layer has an area smaller than an area of the bottom layer and an area of the inorganic layer.

2. The window member of claim 1, wherein the inorganic layer comprises a metal oxide.

3. The window member of claim 1, wherein the pattern layer comprises a silver particle.

4. The window member of claim 1, wherein the pattern layer comprises a same material as a material of the bottom layer.

5. The window member of claim 1, wherein the resin layer is entirely overlapped with the bezel area when viewed in the plan view.

6. The window member of claim 5, wherein the resin layer covers a side surface and an upper surface of the pattern layer in the bezel area.

7. The window member of claim 6, wherein the bottom layer is entirely overlapped with the bezel area when viewed in the plan view.

8. The window member of claim 1, wherein the inorganic layer contacts the resin layer and is spaced apart from the pattern layer.

9. A method of manufacturing a window member, the method comprising:
    providing a cover glass comprising a transmission area configured to pass a light therethrough and a bezel area surrounding the transmission area;
    forming a pattern layer in the bezel area of the cover glass and contacting the cover glass;
    forming a resin layer to cover the pattern layer, at least a portion of the resin layer contacting the cover glass;
    depositing a metal oxide on the resin layer to form an inorganic layer; and
    forming a bottom layer have a color on the inorganic layer, the bottom layer entirely covering the bezel area, and the inorganic layer being between the cover glass and the bottom layer,
    wherein, when viewed in a plan view, the pattern layer has an area smaller than an area of the bottom layer and an area of the inorganic layer.

10. The method of claim 9, wherein the forming of the resin layer comprises:
    covering the pattern layer with a liquid resin;
    curing the liquid resin; and
    cleaning the cured liquid resin by providing a cleaning material.

11. The method of claim 10, wherein the pattern layer is not exposed to the cleaning material in the cleaning process.

12. The method of claim 10, wherein the liquid resin is a light curable resin.

13. The window member of claim 1, wherein the resin layer is entirely overlapped with the bezel area and not overlapped with the transmission area when viewed in the plan view.

* * * * *

UNITED STATES PATENT AND TRADEMARK OFFICE
CERTIFICATE OF CORRECTION

PATENT NO. : 10,490,769 B2
APPLICATION NO. : 15/222826
DATED : November 26, 2019
INVENTOR(S) : Myungan Min Page 1 of 1

It is certified that error appears in the above-identified patent and that said Letters Patent is hereby corrected as shown below:

In the Claims
Column 12, Line 51, Claim 9    delete "have" and insert -- having --

Signed and Sealed this
Twenty-fourth Day of November, 2020

Andrei Iancu
*Director of the United States Patent and Trademark Office*